(12) United States Patent
Awada et al.

(10) Patent No.: US 11,345,048 B2
(45) Date of Patent: May 31, 2022

(54) MOUNTING HEAD

(71) Applicant: FUJI CORPORATION, Chiryu (JP)

(72) Inventors: Takashi Awada, Nagoya (JP); Satoru Otsubo, Anjo (JP)

(73) Assignee: FUJI CORPORATION, Chiryu (JP)

( * ) Notice: Subject to any disclaimer, the term of this patent is extended or adjusted under 35 U.S.C. 154(b) by 282 days.

(21) Appl. No.: 16/603,762

(22) PCT Filed: Apr. 10, 2017

(86) PCT No.: PCT/JP2017/014615
§ 371 (c)(1),
(2) Date: Oct. 8, 2019

(87) PCT Pub. No.: WO2018/189766
PCT Pub. Date: Oct. 18, 2018

(65) Prior Publication Data
US 2020/0114526 A1 Apr. 16, 2020

(51) Int. Cl.
*B25J 15/06* (2006.01)
(52) U.S. Cl.
CPC ................. *B25J 15/0625* (2013.01)
(58) Field of Classification Search
CPC ... B25J 15/0625; B25J 15/08; H05K 13/0408; H05K 13/0404; H05K 13/0409
See application file for complete search history.

(56) References Cited

U.S. PATENT DOCUMENTS

| | | | | |
|---|---|---|---|---|
| 5,457,874 A | * | 10/1995 | Yonezawa | H05K 13/041 29/743 |
| 6,412,166 B1 | * | 7/2002 | Inaba | H05K 13/0417 29/741 |
| 6,571,465 B1 | * | 6/2003 | Shirakawa | H05K 13/021 29/739 |
| 7,065,864 B2 | * | 6/2006 | Yamamoto | H05K 13/0413 29/743 |
| 2017/0034968 A1 | * | 2/2017 | Yokoyama | H05K 13/0413 |

FOREIGN PATENT DOCUMENTS

| | | |
|---|---|---|
| EP | 3 026 995 A1 | 6/2016 |
| JP | 7-186081 A | 7/1995 |

OTHER PUBLICATIONS

International Search Report dated Jul. 11, 2017 in PCT/JP2017/014615 filed Apr. 10, 2017.

* cited by examiner

*Primary Examiner* — Stephen A Vu
(74) *Attorney, Agent, or Firm* — Oblon, McClelland, Maier & Neustadt, L.L.P.

(57) ABSTRACT

A mounting head includes a first air passage and a second air passage through which air is capable of flowing; a first valve configured to switch air flowing through the first air passage between positive pressure and negative pressure; a second valve configured to switch air flowing through the second air passage between positive pressure and negative pressure; a common air passage configured to communicate with the tool, through which air to be supplied to the tool is capable of flowing; and a third valve configured to selectively cause the first air passage or the second air passage to communicate with the common air passage.

10 Claims, 10 Drawing Sheets

Fig. 6

| TOOL TYPE | STATE | FIRST VALVE BP1 | FIRST VALVE BN1 | FIRST AIR PASSAGE | SECOND VALVE BP2 | SECOND VALVE BN2 | SECOND AIR PASSAGE | THIRD VALVE | AIR SUPPLIED TO TOOL |
|---|---|---|---|---|---|---|---|---|---|
| LEAD CHUCK | BEFORE PICK-UP | ON | OFF | HIGH POSITIVE PRESSURE | ON | OFF | LOW POSITIVE PRESSURE | Pos2 | LOW POSITIVE PRESSURE |
| | AT THE TIME OF PICK-UP | ON | OFF | HIGH POSITIVE PRESSURE | ON | OFF | LOW POSITIVE PRESSURE | Pos1 | HIGH POSITIVE PRESSURE |
| | AT THE TIME OF MOVING | ON | OFF | HIGH POSITIVE PRESSURE | OFF | ON | NEGATIVE PRESSURE | Pos1 | HIGH POSITIVE PRESSURE |
| | AT THE TIME OF MOUNTING | ON | OFF | HIGH POSITIVE PRESSURE | OFF | ON | NEGATIVE PRESSURE | Pos2 | NEGATIVE PRESSURE |
| POSITIVE PRESSURE CHUCK | BEFORE PICK-UP | ON | OFF | HIGH POSITIVE PRESSURE | OFF | ON | NEGATIVE PRESSURE | Pos2 | NEGATIVE PRESSURE |
| | AT THE TIME OF PICK-UP | ON | OFF | HIGH POSITIVE PRESSURE | OFF | ON | NEGATIVE PRESSURE | Pos1 | HIGH POSITIVE PRESSURE |
| | AT THE TIME OF MOVING | ON | OFF | HIGH POSITIVE PRESSURE | OFF | ON | NEGATIVE PRESSURE | Pos1 | HIGH POSITIVE PRESSURE |
| | AT THE TIME OF MOUNTING | ON | OFF | HIGH POSITIVE PRESSURE | OFF | ON | NEGATIVE PRESSURE | Pos2 | NEGATIVE PRESSURE |
| NEGATIVE PRESSURE CHUCK | BEFORE PICK-UP | OFF | ON | NEGATIVE PRESSURE | ON | OFF | HIGH POSITIVE PRESSURE | Pos2 | HIGH POSITIVE PRESSURE |
| | AT THE TIME OF PICK-UP | OFF | ON | NEGATIVE PRESSURE | ON | OFF | HIGH POSITIVE PRESSURE | Pos1 | HIGH POSITIVE PRESSURE |
| | AT THE TIME OF MOVING | OFF | ON | NEGATIVE PRESSURE | ON | OFF | HIGH POSITIVE PRESSURE | Pos1 | HIGH POSITIVE PRESSURE |
| | AT THE TIME OF MOUNTING | OFF | ON | NEGATIVE PRESSURE | ON | OFF | — | Pos2 | HIGH POSITIVE PRESSURE |
| SUCTION NOZZLE | BEFORE PICK-UP | OFF | ON | NEGATIVE PRESSURE | OFF | OFF | LOW POSITIVE PRESSURE | Pos2 | NEGATIVE PRESSURE |
| | AT THE TIME OF PICK-UP | OFF | ON | NEGATIVE PRESSURE | OFF | OFF | — | Pos1 | NEGATIVE PRESSURE |
| | AT THE TIME OF MOVING | OFF | ON | NEGATIVE PRESSURE | OFF | OFF | — | Pos1 | NEGATIVE PRESSURE |
| | AT THE TIME OF MOUNTING | OFF | ON | NEGATIVE PRESSURE | ON | OFF | LOW POSITIVE PRESSURE | Pos2 | LOW POSITIVE PRESSURE |

MOUNTING HEAD

TECHNICAL FIELD

The present application relates to a mounting head.

BACKGROUND ART

A mounting head constitutes a component mounting machine that mounts a component on a circuit board and is used for a mounting process by the component mounting machine. A tool such as a suction nozzle is detachably attached to the mounting head. For example, the suction nozzle, being supplied with negative pressure air from the mounting head, sucks the component to pick up and hold the component. In addition to the suction nozzle, a tool such as a chuck is attached to the mounting head in order to enable various components to be picked up. Patent Literature 1 discloses, for example, a chuck which is supplied with negative pressure air to grip a component in the same manner as the suction nozzle.

PATENT LITERATURE

Patent Literature 1: JP-A-7-186081

SUMMARY OF THE INVENTION

Technical Problem

Incidentally, in order for a tool that picks up and places components to handle various components and various holding operations, improvements to performance and adding of functions have been attempted. The mounting head needs to be capable of supplying air to the tool by switching between positive and negative air pressure in order to handle a variety of tools. An object of the present specification is to provide a mounting head capable of supplying air to a tool in which air is switched between positive pressure and negative pressure so as to handle various tools.

Solution to Problem

The present specification discloses a first mounting head, to which a tool configured to pick up a component by being supplied with positive pressure air or negative pressure air is detachably attached, configured to be used for a mounting process in which the component picked up by the tool is mounted on a circuit board, the first mounting head including: a first air passage and a second air passage through which air is capable of flowing; a first valve configured to switch air flowing through the first air passage between positive pressure and negative pressure; a second valve configured to switch air flowing through the second air passage between positive pressure and negative pressure; a common air passage configured to communicate with the tool, through which air to be supplied to the tool is capable of flowing; and a third valve configured to selectively cause the first air passage or the second air passage to communicate with the common air passage.

The present specification discloses a second mounting head, to which a tool configured to pick up a component by being supplied with positive pressure air or negative pressure air is detachably attached, configured to be used for a mounting process in which the component picked up by the tool is mounted on a circuit board, the second mounting head including: a first air passage and a second air passage through which air is capable of flowing; a common air passage configured to communicate with the tool, through which air to be supplied to the tool is capable of flowing; a third valve configured to selectively cause the first air passage or the second air passage to communicate with the common air passage; and a passage shutoff device configured to shut off air flow between the common air passage and the outside in a case where the tool is removed.

Advantageous Effect of the Invention

With the configuration of the first mounting head, by switching the first valve and the second valve, positive pressure air and negative pressure air can be selectively caused to flow in the first air passage, and positive pressure air and negative pressure air can be selectively caused to flow in the second air passage. As a result, by switching of the third valve, the air supplied to the tool can be switched between positive pressure and negative pressure. Accordingly, the mounting head can handle various tools such as a tool which picks up components with positive pressure air and a tool which picks up components with negative pressure air.

With the configuration of the second mounting head, a leakage of positive pressure air or negative pressure air from the common air passage can be prevented. In addition, in a case where multiple tools are attachable to the mounting head and the number of the attached tools is smaller than a maximum number, the air pressure supplied to the tools can be stabilized. Further, the operation load on the air supply source can be reduced.

BRIEF DESCRIPTION OF DRAWINGS

FIG. 6 A table showing the relationship of each valve and air supplied to a tool in a mounting process.

DESCRIPTION OF EMBODIMENTS

1. Embodiment 1-1. Overview of Mounting Head 20

Mounting head 20 constitutes a component mounting machine (not shown) that mounts a component on a circuit board. Mounting head 20 is detachably provided on moving body 12 that can be moved in a horizontal direction (XY-direction) by XY moving device 11 of the component mounting machine. In a mounting process of the component, the component mounting machine first picks up a component supplied by a component supply device with a tool attached to mounting head 20. Next, the component mounting machine moves mounting head 20 and then lowers the tool to mount the component at a predetermined position on the circuit board.

1-2. Configuration of Mounting Head 20

Figure 1:
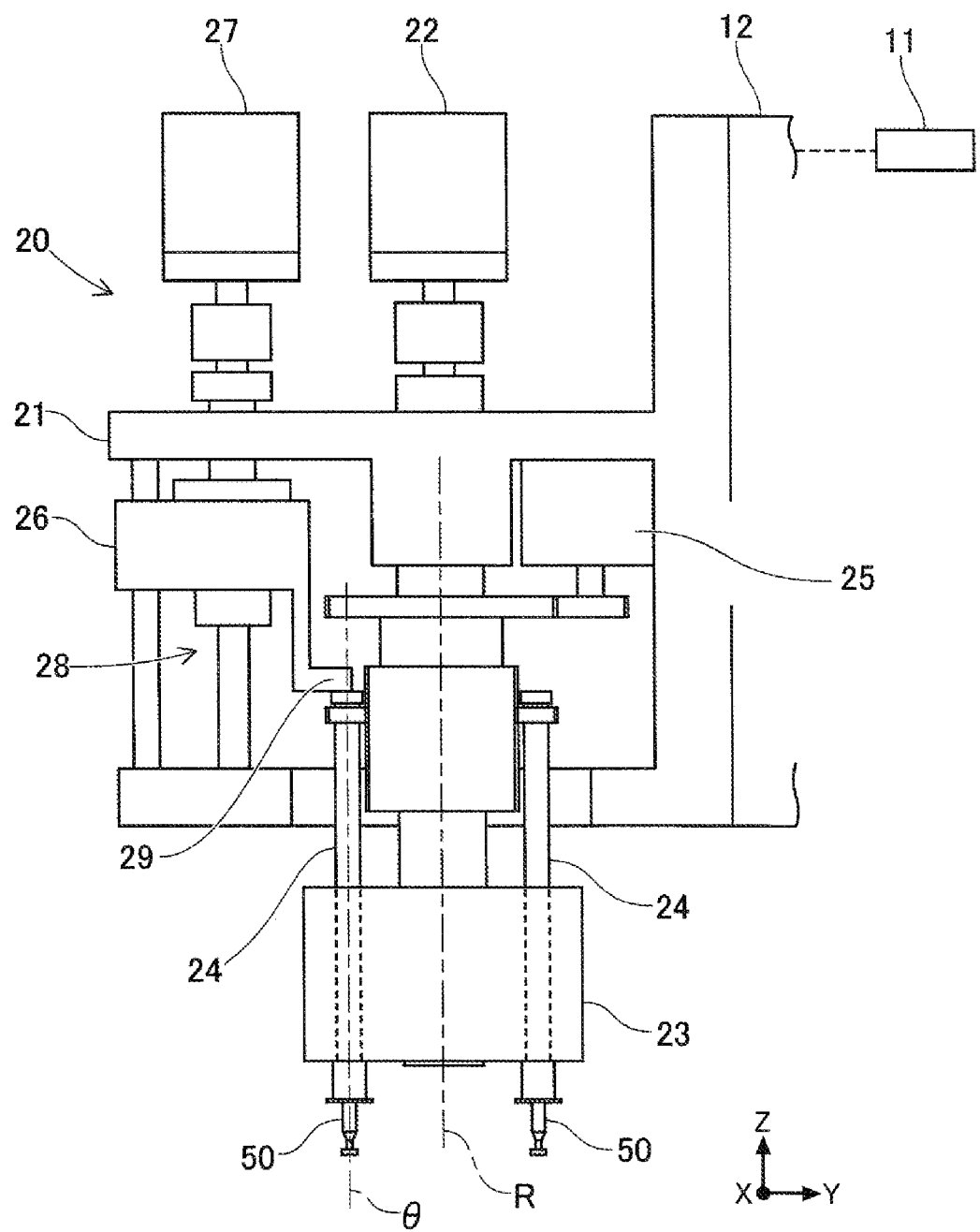
FIG. 1 A side view showing a mounting head in an embodiment.

As shown in FIG. 1, mounting head 20 has head main body 21 clamped to moving body 12. Head main body 21 is provided with rotary head 23 such that the rotation angle can be indexed at every predetermined angle by R-axis motor 22. Rotary head 23 holds multiple (for example, twelve) tool shafts 24 slidably and rotatably in a Z-axis direction (up-down direction in FIG. 1) at equal intervals in a circumferential direction on a circumference concentric with an R-axis (see FIG. 3A).

Tool shaft 24 is urged upward with respect to rotary head 23 by the elastic force of a spring (not shown). Accordingly, in a normal state in which no external force is applied, tool shaft 24 is positioned at a lifting end. At the lower end of tool shaft 24, a tool that is supplied with positive pressure air or negative pressure air to pick up the component is detachably attached. The tool includes suction nozzle 50 and lead chuck 60, which is a type of chuck (see FIG. 4). A detailed configuration of lead chuck 60 will be described later.

Suction nozzle 50 is supplied with negative pressure air through in-nozzle air passage 51 to suck the component. Multiple suction nozzles 50 are subsequently indexed to a predetermined angle position around the R-axis (for example, a lifting and lowering position of tool shaft 24) by a rotation of rotary head 23 accompanying a drive of R-axis motor 22. Mounting head 20 has θ-axis motor 25 fixed to head main body 21. All tool shafts 24 are connected to an output shaft of θ-axis motor 25 so as to be capable of transmitting a rotational force via multiple gears. Tool shaft 24 and suction nozzle 50 rotate (turn around on an axis) integrally around an θ-axis by an operation of θ-axis motor 25, and the rotation angle and a rotation speed are controlled.

Head main body 21 is provided with actuating member 26 movable in the up-down direction (the Z-axis direction). Actuating member 26 is lifted and lowered in the Z-axis direction by ball screw mechanism 28 which is operated by a drive of Z-axis motor 27. Actuating member 26 has lever 29 which contacts the upper end of tool shaft 24 which is indexed to the above-described lifting and lowering position among multiple tool shafts 24.

Lever 29 lowers as actuating member 26 moves downward in the Z-axis direction. Lever 29 pushes a contacting tool shaft 24 downward in the Z-axis direction against the elastic force of the spring of tool shaft 24 to lower tool shaft 24. Tool shaft 24 and suction nozzle 50 are integrally lifted and lowered in the Z-axis direction by the drive of Z-axis motor 27, and the position in the Z-direction and a movement speed are controlled.

1-3. Configuration of Air Supply Circuit 30

Figure 2:
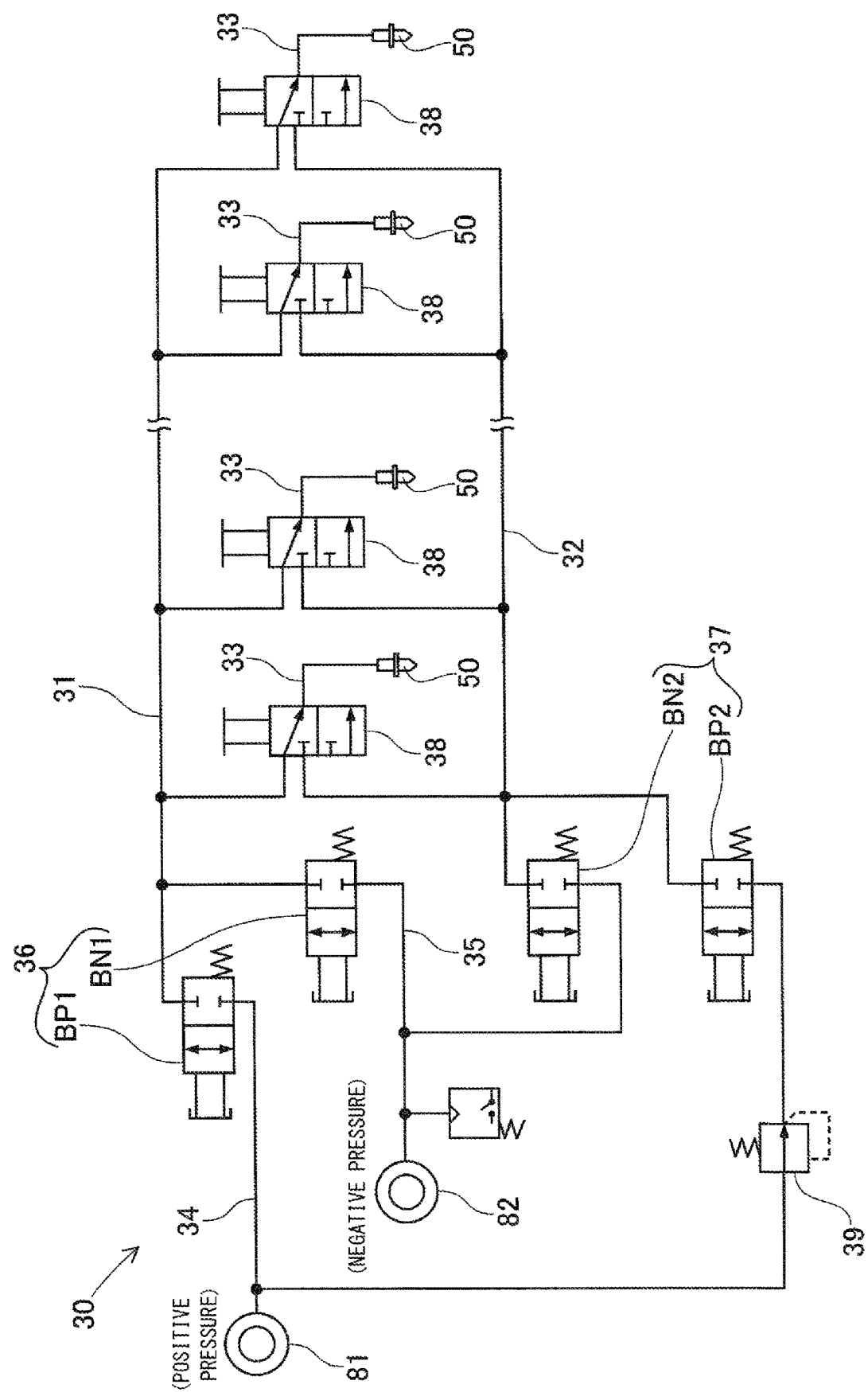
FIG. 2 A circuit diagram showing an air supply circuit configured in the mounting head.

As shown in FIG. 2, mounting head 20 includes air supply circuit 30 that can supply positive pressure air or negative pressure air to a tool (such as suction nozzle 50). Air supply circuit 30 includes first air passage 31, second air passage 32, multiple common air passages 33, positive pressure air passage 34, and negative pressure air passage 35 through which air can flow. Air supply circuit 30 includes first valve 36, second valve 37, and multiple third valves 38 that switch the flow of air.

First valve 36 switches air flowing through first air passage 31 between positive pressure and negative pressure. Specifically, first valve 36 switches the air flowing through first air passage 31 between positive pressure and negative pressure by selectively causing positive pressure air supply source 81, which supplies positive pressure air, or negative pressure air supply source 82, which supplies negative pressure air, to communicate with first air passage 31. Positive pressure air supply source 81 is constituted by a blower, a compressor, or the like provided outside mounting head 20. Negative pressure air supply source 82 is constituted by a negative pressure pump or the like provided inside mounting head 20.

In the present embodiment, first valve 36 includes first positive pressure valve BP1 and first negative pressure valve BN1. First positive pressure valve BP1 switches between turning on and shutting off of communication states between first air passage 31 and positive pressure air supply source 81. In detail, first positive pressure valve BP1 switches between turning on and shutting off of communication states between positive pressure air passage 34 through which the positive pressure air supplied from positive pressure air supply source 81 flows and first air passage 31.

First negative pressure valve BN1 switches between turning on and shutting off of communication states between first air passage 31 and negative pressure air supply source 82. In detail, first negative pressure valve BN1 switches between turning on and shutting off communication between negative pressure air passage 35 through which negative pressure air supplied from negative pressure air supply source 82 flows and first air passage 31. First positive pressure valve BP1 and first negative pressure valve BN1 are solenoid valves in two positions in the present embodiment, and are configured to be independently operable.

In a case where a solenoid is energized by a power supply, first positive pressure valve BP1 is in an opened state ("ON" in FIG. 6) to allow positive pressure air to flow. Accordingly, positive pressure air passage 34 communicates with first air passage 31, and positive pressure air is supplied to the tool side. First positive pressure valve BP1 is in a closed state ("OFF" in FIG. 6) in a case where the solenoid is not powered, and communication between first air passage 31 and positive pressure air passage 34 is shut off.

In a case where the solenoid is energized by the power supply, first negative pressure valve BN1 is in an opened state ("ON" in FIG. 6) to allow negative pressure air to flow. Accordingly, negative pressure air passage 35 communicates with first air passage 31, and negative pressure air is supplied to the tool side. First negative pressure valve BN1 is in a closed state ("OFF" in FIG. 6) in a case where the solenoid is not powered, and communication between first air passage 31 and negative pressure air passage 35 is shut off.

Second valve 37 causes the air flowing through second air passage 32 to switch between positive pressure and negative pressure. Specifically, second valve 37 causes the air flowing through second air passage 32 to switch between positive pressure and negative pressure by selectively causing positive pressure air supply source 81 or negative pressure air supply source 82 to communicate with second air passage 32. In the present embodiment, second valve 37 includes second positive pressure valve BP2 and second negative pressure valve BN2.

Second positive pressure valve BP2 switches between turning on and shutting off of communication states between second air passage 32 and positive pressure air passage 34. Second negative pressure valve BN2 switches between turning on and shutting off of communication states between second air passage 32 and negative pressure air passage 35. Second positive pressure valve BP2 and second negative pressure valve BN2 are solenoid valves in two positions in the present embodiment, and are configured to be independently operable.

In a case where the solenoid is energized by the power supply, second positive pressure valve BP2 is in an opened state ("ON" in FIG. 6) to allow positive pressure air to flow. Accordingly, positive pressure air passage 34 communicates with second air passage 32, and positive pressure air is supplied to the tool side. Second positive pressure valve BP2 is in a closed state ("OFF" in FIG. 6) in a case where the solenoid is not powered, and communication between second air passage 32 and positive pressure air passage 34 is shut off.

In a case where the solenoid is energized by the power supply, second negative pressure valve BN2 is in an opened state ("ON" in FIG. 6) to allow negative pressure air to flow. Accordingly, negative pressure air passage 35 communicates with second air passage 32, and the negative pressure air is supplied to the tool side. Second negative pressure valve BN2 is closed in a case where the solenoid is not powered ("OFF" in FIG. 6), and communication between second air passage 32 and negative pressure air passage 35 is shut off.

Figure 3A:
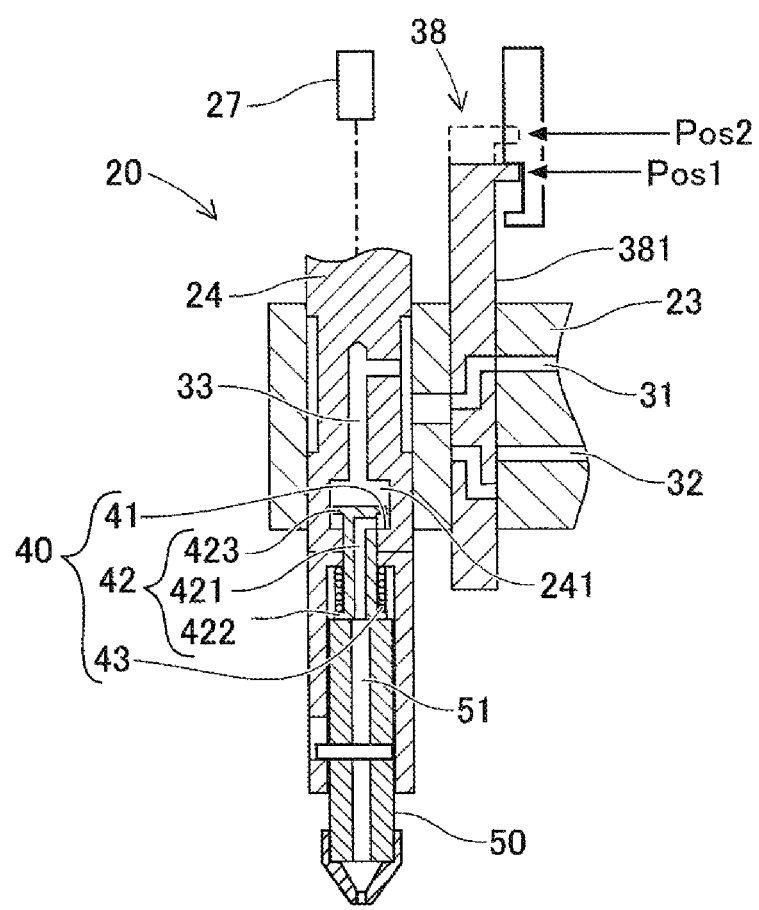
FIG. 3A A sectional view showing a state in which a suction nozzle is attached to the mounting head.

Each of multiple common air passages 33 communicates with a corresponding tool to allow the air supplied to the tool to be capable of flowing. Specifically, as shown in FIG. 3A, common air passage 33 is constituted by an air passage of rotary head 23 and an air passage of tool shaft 24 communicating with the air passage. The number of common air passages 33 is equal to the number of tool shafts 24 provided in rotary head 23. In addition, in the present embodiment, in a case where the tool such as suction nozzle 50 or lead chuck 60 is attached to tool shaft 24, common air passage 33 constantly communicates with the tool such that air can be supplied to the tool.

Figure 3B:
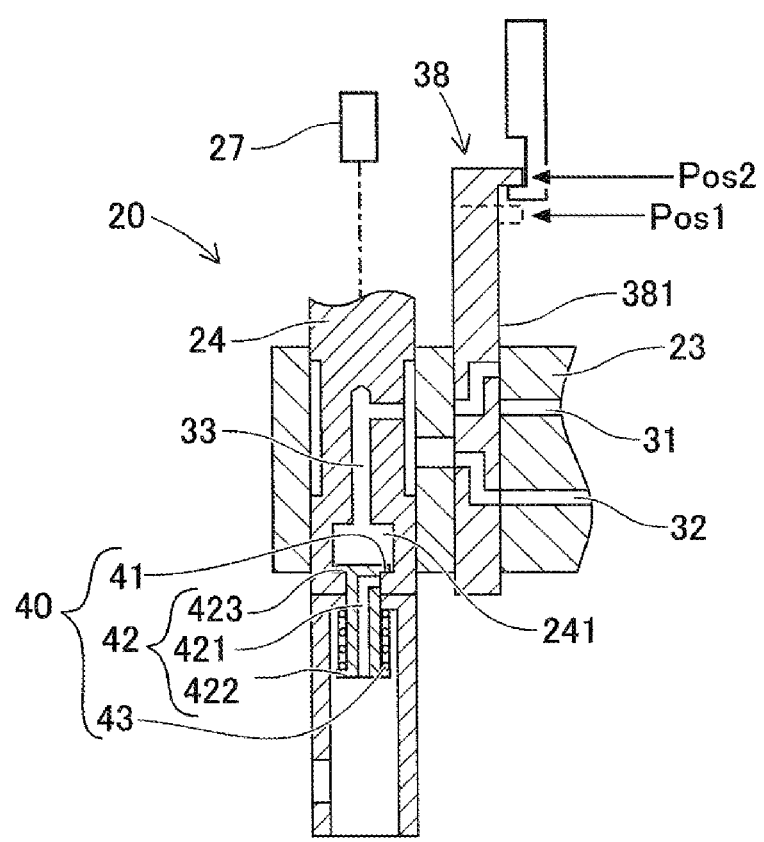
FIG. 3B A sectional view showing a state in which the suction nozzle is removed from the mounting head.

Third valve 38 selectively causes first air passage 31 or second air passage 32 to communicate with common air passage 33. In the present embodiment, third valve 38 is a mechanical valve having spool 381. As shown in FIGS. 3A and 3B, third valve 38 is held by slidably fitting spool 381 to rotary head 23 in the up-down direction. For third valve 38, spool 381 is lifted and lowered, for example, by a drive of a stepping motor (not shown) to control a position in the up-down direction with respect to rotary head 23.

Specifically, as shown in FIG. 3A, in a case where spool 381 is positioned at the first position ("Pos1" in FIG. 6), third valve 38 causes first air passage 31 to communicate with common air passage 33. Accordingly, positive pressure air or negative pressure air flowing through first air passage 31 is supplied to the tool such as suction nozzle 50 via common air passage 33. On the other hand, as shown in FIG. 3B, in a case where spool 381 is positioned at the second position ("Pos2" in FIG. 6), third valve 38 causes second air passage 32 to communicate with common air passage 33. Accordingly, positive pressure air or negative pressure air flowing through second air passage 32 is supplied to the tool such as suction nozzle 50 via common air passage 33.

Regulator valve 39 is disposed between positive pressure air supply source 81 and second valve 37. Specifically, regulator valve 39 is disposed in a portion of positive pressure air passage 34 that connects positive pressure air supply source 81 and second positive pressure valve BP2 of second valve 37. Regulator valve 39 regulates air pressure supplied by positive pressure air supply source 81. In the present embodiment, regulator valve 39 reduces air pressure of positive pressure air, supplied by positive pressure air supply source 81, by about 40% to a regulated pressure. As a result, second positive pressure valve BP2 is supplied with positive pressure air having pressure lower than the positive pressure air supplied to first positive pressure valve BP1.

According to air supply circuit 30 having the above described configuration, for example, in a case where spool 381 of third valve 38 is positioned at the first position, it is possible to switch the air supplied to the tool between positive pressure and negative pressure by switching first valve 36 and second valve 37. In addition, in a state in which the tool is operated by moving spool 381 to the first position, it is possible to prepare the air to be supplied to the tool in advance in a case of switching only second valve 37 and moving spool 381 to the second position.

1-4. Configuration of Passage Shutoff Device 40

In the present embodiment, mounting head 20 includes passage shutoff device 40, as shown in FIGS. 3A and 3B. Passage shutoff device 40 shuts off the air flow between common air passage 33 and the outside in a case where the tool such as suction nozzle 50 is removed from rotary head 23. In the present embodiment, passage shutoff device 40 includes locking section 41, seal member 42, and in-shaft compression spring 43.

Locking section 41 is formed inside common air passage 33. Specifically, as shown in FIG. 3A, locking section 41 is a portion in which an inner diameter of air conduit 241 constituting common air passage 33 is small in an intermediate portion of tool shaft 24. Seal member 42 is locked to locking section 41 to shut off the air flow in common air passage 33. Specifically, seal member 42 is formed in a cylindrical shape in which air conduit 421 constituting common air passage 33 is formed on the inside. Seal member 42 is supported by a small diameter portion of tool shaft 24 to be slidable in the up-down direction.

Air conduit 421 of seal member 42 is formed through a lower flange section 422 formed at the lower end of seal member 42. In addition, air conduit 421 is formed to be bent outward below upper flange section 423 formed at the upper end of seal member 42. Lower flange section 422 and upper flange section 423 are formed such that each outer diameter is smaller than the inner diameter of air conduit 241 of tool shaft 24, and are configured such that the air can flow outside in a radial direction.

In-shaft compression spring 43 is an elastic member that urges seal member 42 to locking section 41. Specifically, in-shaft compression spring 43 is disposed coaxially with seal member 42 and between locking section 41 and lower flange section 422. Accordingly, seal member 42 is urged by the elastic force of in-shaft compression spring 43 such that upper flange section 423 contacts locking section 41.

That is, in passage shutoff device 40, upper flange section 423 of seal member 42 is brought into close contact with locking section 41 by the elastic force of in-shaft compression spring 43 so that air conduit 241 of tool shaft 24 and air conduit 421 of seal member 42 are not in communication with each other. In this manner, as shown in FIG. 3B, in a case where the tool such as suction nozzles 50 is removed from tool shaft 24, seal member 42 is urged by in-shaft compression spring 43 to be locked to locking section 41, and thus passage shutoff device 40 shuts off the air flow.

In a case where the tool is attached to tool shaft 24, as shown in FIG. 3A, seal member 42 is pushed up by the tool against the elastic force of in-shaft compression spring 43. Accordingly, upper flange section 423 of seal member 42 separates from locking section 41, and passage shutoff device 40 causes air conduit 241 of tool shaft 24 to communicate with air conduit 421 of seal member 42 so as to allow the air flow. In this manner, passage shutoff device 40 is configured to automatically allow or shut off the air flow between common air passage 33 and the outside according to the attachment or detachment of the tool to or from tool shaft 24, regardless of the control from the outside.

1-5. Configuration of Lead Chuck 60

The configuration of lead chuck 60 will be described with reference to FIG. 4 and FIGS. 5A to 5D. Lead chuck 60 is a type of chuck that grips a component as described above, and particularly grips lead component 90 as a target. As shown in FIG. 5B, lead component 90 includes component main body 91 and multiple leads 92 extending downward from component main body 91. Note that lead 92 functions as an electrode for lead component 90 or a positioning pin with respect to an electrode or circuit board Bd.

Figure 4:
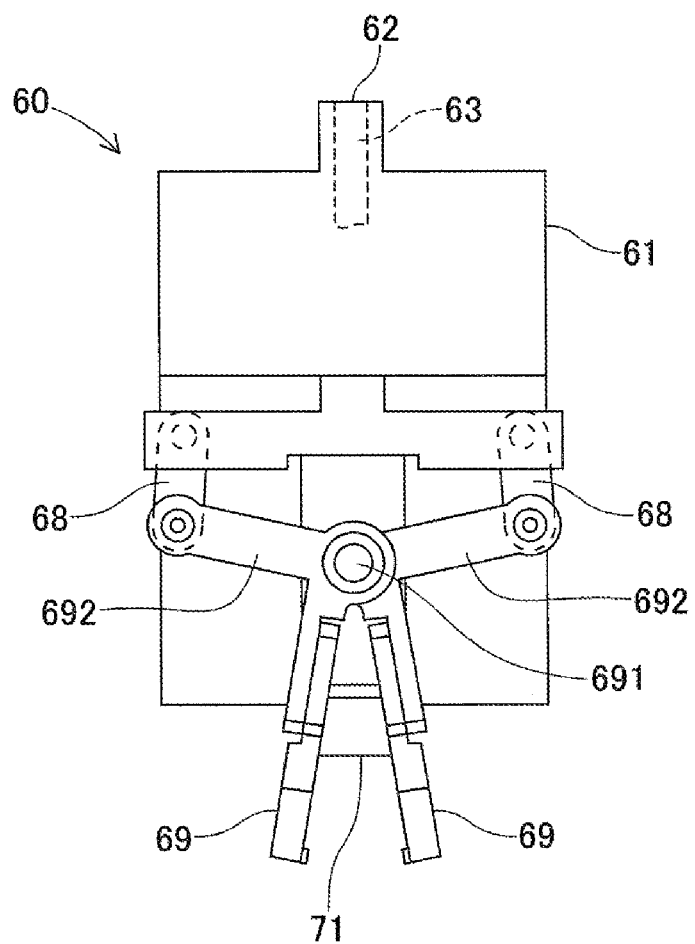
FIG. 4 A front view of a chuck.
Figure 5A:
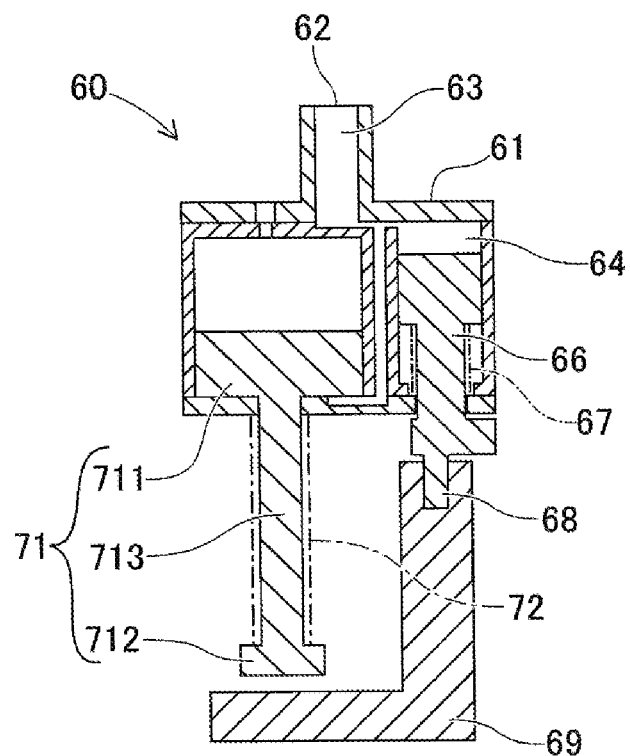
FIG. 5A A sectional view showing a state of a lead chuck before a pick-up.
Figure 5B:
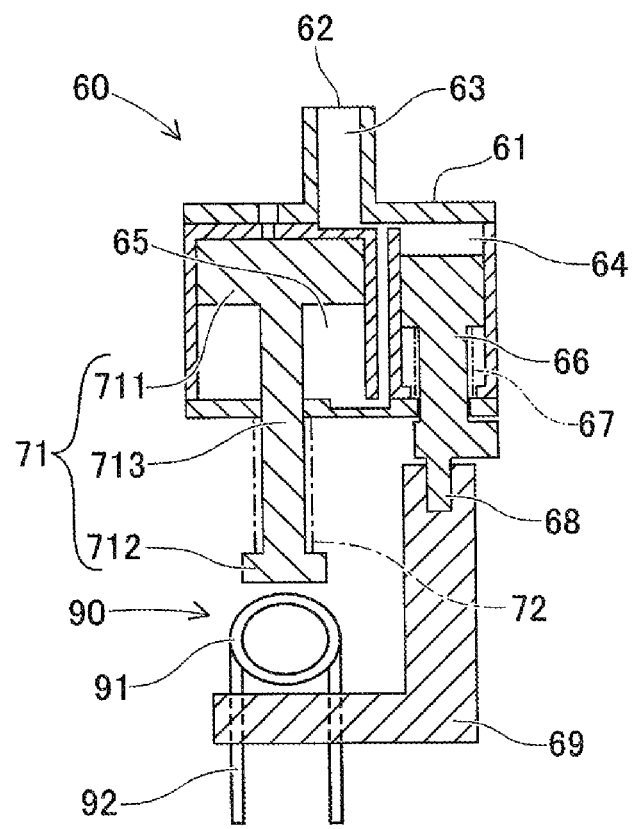
FIG. 5B A sectional view showing a state of the lead chuck at the time of the pick-up.

As shown in FIGS. 4 and 5B, in lead chuck 60, air introduction port 62, which communicates with common air passage 33 on a side of rotary head 23, is formed in chuck main body 61 attached to tool shaft 24. Further, in chuck main body 61, first pressure chamber 64 and second pressure chamber 65, which communicate via air introduction port 62 and in-chuck air passage 63, are formed. Piston 66 is slidably disposed in first pressure chamber 64.

Piston 66 is urged to an upper wall side of first pressure chamber 64 by the elastic force of first compression spring 67 disposed between the head section of piston 66 and the bottom section of first pressure chamber 64. That is, in a case where the air pressure in first pressure chamber 64 is less than a predetermined value, piston 66 is positioned at the upper end to decrease a volume of first pressure chamber 64. On the other hand, in a case where the air pressure of first pressure chamber 64 is a predetermined value or more, piston 66 moves downward to increase the volume of first pressure chamber 64 against the elastic force of first compression spring 67.

As shown in FIG. 4, a pair of clamp claws 69 is connected to the lower portion of piston 66 via link mechanism 68. The pair of clamp claws 69 is supported by chuck main body 61 to be rotatable around shaft section 691. As shown in FIG. 5A, in the pair of clamp claws 69, claw tip sections are formed to bend in an L-shape in a side view of lead chuck 60. As shown in FIG. 4, arm sections 692, which project to a back surface side of clamp claws 69, are respectively formed on the upper portion of the pair of clamp claws 69.

Figure 5C:
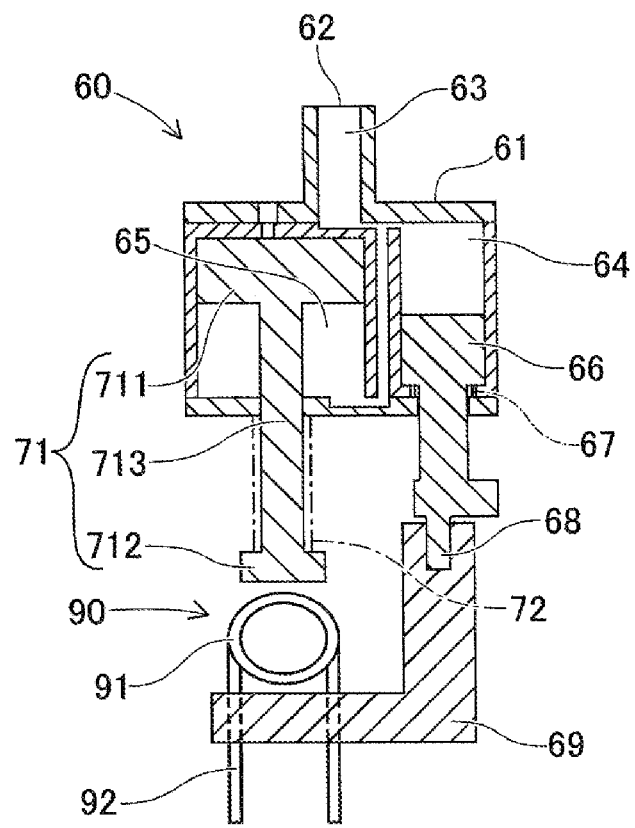
FIG. 5C A sectional view showing a state of the lead chuck at the time of moving.

Accordingly, in a case where tip ends of arm sections 692 are moved downward, clamp claws 69 rotate around shaft section 691 in a direction in which the claw tip sections are closed (a clamping direction). Therefore, in a case where the positive pressure air of the predetermined value or more is supplied to first pressure chamber 64 and piston 66 is moved downward, the tip ends of arm sections 692 of the pair of clamp claws 69 are moved downward via link mechanism 68. Accordingly, the pair of clamp claws 69 rotates in the direction in which the claw tip sections are closed. As a result, as shown in FIG. 5C, lead chuck 60 is in a clamping state to grip lead component 90 between the pair of clamp claws 69.

Then, in a case where the air pressure in first pressure chamber 64 decreases and piston 66 is moved upward, the tip ends of arm sections 692 of the pair of clamp claws 69 are moved upward via link mechanism 68. Accordingly, the pair of clamp claws 69 rotates in a direction in which the claw tip sections are opened (a unclamping direction). As a result, lead chuck 60 is in an initial state shown in FIGS. 4 and 5A or in an unclamping state shown in FIG. 5D.

Piston section 711 formed at the upper end of pusher 71 is slidably disposed in second pressure chamber 65. As shown in FIG. 4, pusher 71 is disposed at the center of the pair of clamp claws 69 in the left-right direction in a front view of lead chuck 60. In addition, as shown in FIG. 5B, pusher 71 is disposed to be positioned above lead component 90 gripped by the pair of clamp claws 69.

Figure 5D:
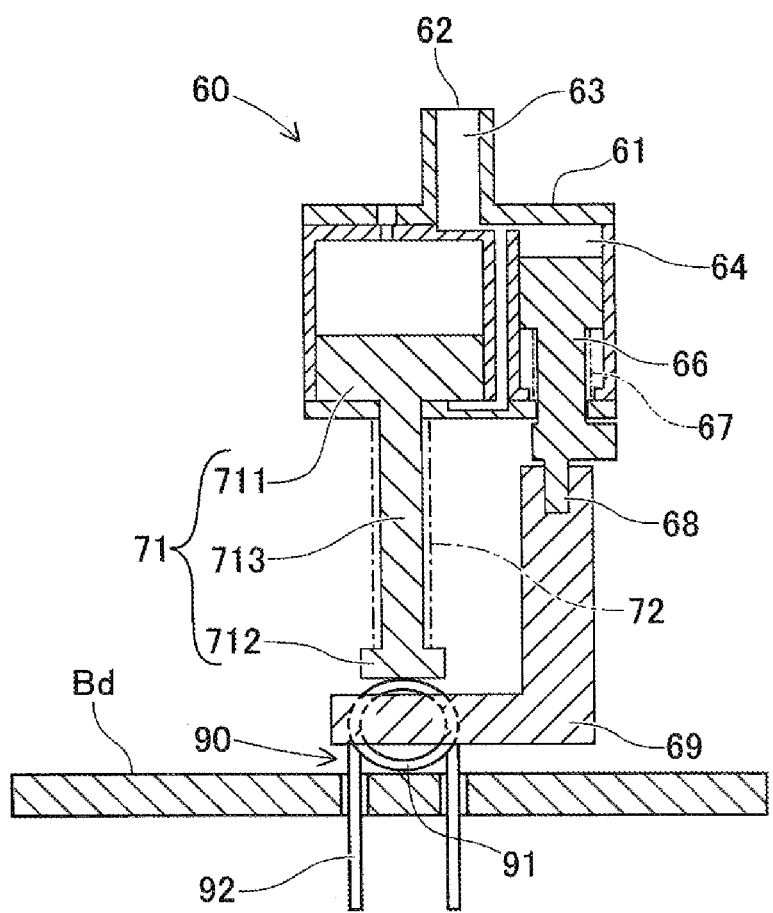
FIG. 5D A sectional view showing a state of the lead chuck at the time of mounting.

Pusher 71 is configured to connect piston section 711 and lower end 712 that presses the upper surface of lead component 90 by rod 713. Pusher 71 is urged to the bottom side of second pressure chamber 65 by the elastic force of second compression spring 72 disposed on the outer circumferential side of rod 713 which is between the bottom section of second pressure chamber 65 and piston section 711. That is, in a case where the air pressure of second pressure chamber 65 is less than the predetermined value, pusher 71 is positioned at the lower end such that the volume of second pressure chamber 65 decreases as shown in FIGS. 5A and 5D. On the other hand, in a case where the air pressure of second pressure chamber 65 is the predetermined value or more, pusher 71 is moved upward against the elastic force of second compression spring 72 to increase the volume of second pressure chamber 65, as shown in FIG. 5B and FIG. 5C.

Here, in the present embodiment, the elastic force of first compression spring 67 and a pressure receiving area of piston 66 are set such that piston 66 does not move in a case where the positive pressure air supplied by positive pressure air supply source 81 is supplied after being decompressed by regulator valve 39, and piston 66 moves downward in a case where the positive pressure air is supplied without passing through regulator valve 39.

On the other hand, the elastic force of second compression spring 72 and the pressure receiving area of piston section 711 are set such that pusher 71 moves upward in a case where the positive pressure air is supplied after being decompressed by regulator valve 39, in addition to the case where the positive pressure air supplied from positive pressure air supply source 81 is supplied without passing through regulator valve 39. Hereinafter, for convenience of description, the positive pressure air of the air pressure supplied by positive pressure air supply source 81 is referred to as "high positive pressure air", and the positive pressure air decompressed by regulator valve 39 is referred to as "low positive pressure air".

According to the above-described configuration, in lead chuck 60, in a case where the low positive pressure air is supplied to air introduction port 62 from the initial state in which the air is not supplied (FIG. 5A), pusher 71 is moved upward while maintaining the unclamping state in which the pair of clamp claws 69 is opened, as shown in FIG. 5B. Further, in a case where the high positive pressure air is supplied to air introduction port 62, lead chuck 60 shifts to the clamping state in which the pair of clamp claws 69 are closed while pusher 71 is positioned above, as shown in FIG. 5C.

Further, in a case where air introduction port 62 is supplied with the negative pressure or is shut off from the air supply, the pair of clamp claws 69 is opened for lead chuck 60 to be in the unclamping state, as shown in FIG. 5D. At this time, pusher 71 is moved downward and contacts the upper surface of lead component 90 positioned between the pair of clamp claws 69 to press lead component 90 downward (on the side of circuit board Bd). In this manner, lead chuck 60 is configured to be capable of being in various states according to the supplied air.

As described above, lead chuck 60 of the present embodiment uses the positive pressure air to grip lead component 90. Such a configuration can supply a large amount of air pressure to increase the gripping force as compared with a negative pressure chuck that uses negative pressure air to grip the component. In addition, since the main purpose of an air conduit constituting in-chuck air passage 63 is to cause positive pressure air to flow, the requirement for airtightness is not as strict as that of the configuration in which negative pressure air flows. Accordingly, the configuration of a movable section or the like is simple. As a result, lead chuck 60 can be miniaturized and the manufacturing cost can be reduced.

1-6. Operation of Mounting Head 20 in Mounting Process

The operation of mounting head 20 in the mounting process executed by the component mounting machine will be described with reference to FIG. 3A, FIGS. 5A to 5D, and FIG. 6. Mounting head 20 in the mounting process includes, as shown in FIG. 6, a state before a pick-up in which mounting head 20 is moved to a supply position of the component, a state at the time of the pick-up in which the component is picked up using the tool, a state at the time of moving to above circuit board Bd while the picked up component is held, and a state at the time of mounting in which the component is mounted at a predetermined position of circuit board Bd.

1-6-1. Mounting Process Using Lead Chuck 60

Here, it is assumed that lead chuck 60 as a tool is attached to tool shaft 24 of mounting head 20. Before the pick-up, mounting head 20 turns on first positive pressure valve BP1 of first valve 36 and turns off first negative pressure valve BN1. Accordingly, first air passage 31 is in a state in which high positive pressure air is supplied. In addition, mounting head 20 turns on second positive pressure valve BP2 of second valve 37 and turns off second negative pressure valve BN2. Accordingly, second air passage 32 is in a state in which low positive pressure air is supplied.

Further, mounting head 20 sets third valve 38 to be at second position (Pos2) and causes second air passage 32 to communicate with common air passage 33. Accordingly, low positive pressure air is supplied to lead chuck 60 via common air passage 33. In FIG. 6, the air selected by switching of third valve 38 is indicated by a bold solid line frame. As shown in FIG. 5B, lead chuck 60 supplied with low positive pressure air is in the unclamping state and in a state in which pusher 71 is moved upward (hereinafter referred to as a "press-preparation state").

Next, at the time of the pick-up, while maintaining the states of first valve 36 and second valve 37, mounting head 20 sets third valve 38 to be at the first position (Pos1) and causes first air passage 31 to communicate with common air passage 33. Accordingly, the high positive pressure air is supplied to lead chuck 60 via common air passage 33. Lead chuck 60 supplied with high positive pressure air is in the clamping state and maintains the press-preparation state, as shown in FIG. 5C.

Subsequently, at the time of the moving, mounting head 20 turns off second positive pressure valve BP2 of second valve 37 and turns on second negative pressure valve BN2 while maintaining the states of first valve 36 and third valve 38. Accordingly, second air passage 32 is in a state in which negative pressure air is supplied. However, since third valve 38 is not switched at the time of the moving, the state of lead chuck 60, in which high positive pressure air is supplied, is maintained.

Finally, at the time of the mounting, while maintaining the states of first valve 36 and second valve 37, mounting head 20 sets third valve 38 to be at the second position (Pos2), and causes second air passage 32 to communicate with common air passage 33. Accordingly, negative pressure air is supplied to lead chuck 60 via common air passage 33. As shown in FIG. 5D, lead chuck 60 supplied with negative pressure air is in the unclamping state and in a state in which pusher 71 is moved downward (hereinafter, referred to as a "press state").

In a case where the supply of the positive pressure air is shut off, lead chuck 60 shifts to the unclamping state and the press state by the elastic force of first compression spring 67 and second compression spring 72. However, in a case where the airtightness of air supply circuit 30 is secured, it requires time to shift to the unclamping state and the press state. Therefore, at the time of the mounting, mounting head 20 sucks the air from first pressure chamber 64 and second pressure chamber 65 by supplying negative pressure air to lead chuck 60. By such an operation, the time required for shifting to the unclamping state and the press state is shortened.

In this manner, first at the time of the mounting, mounting head 20 sets the states of positive pressure and negative pressure of the air, flowing through first air passage 31 and second air passage 32, to be different from each other, by switching first valve 36 and second valve 37. Further, in the above-described state, mounting head 20 switches a holding state (the clamping state) and a non-holding state (the unclamping state) of lead component 90 by lead chuck 60 by switching third valve 38.

In a case where the mounting of lead components 90 by all lead chucks 60 attached to rotary head 23 is ended and then lead component 90 is to be picked up again, mounting head 20 turns on second positive pressure valve BP2 of second valve 37 and turns off the second negative pressure valve BN2 in order to obtain a state before the pick-up, while maintaining the states of first valve 36 and third valve 38. Accordingly, second air passage 32 is in a state in which low positive pressure air is supplied. As shown in FIG. 5B, lead chuck 60 supplied with low positive pressure air is in the press-preparation state while maintaining the unclamping state.

1-6-2. Mounting Process Using Positive Pressure Chuck

Here, it is assumed that a positive pressure chuck (not shown) as a tool is attached to tool shaft 24 of mounting head 20. The positive pressure chuck does not have pusher 71 unlike lead chuck 60 and is a tool that shifts from the unclamping state to the clamping state in a case where the positive pressure air is supplied. Therefore, as shown in FIG. 6, mounting head 20 maintains the states of first valve 36 and second valve 37 in any state in the mounting process, and switches the unclamping state and the clamping state only by the switching of third valve 38.

Specifically, mounting head 20 turns on first positive pressure valve BP1 of first valve 36 and turns off first negative pressure valve BN1. Accordingly, first air passage 31 is in a state in which high positive pressure air is supplied. Mounting head 20 turns off second positive pressure valve BP2 of second valve 37 and turns on second negative pressure valve BN2. Accordingly, second air passage 32 is in a state in which negative pressure air is supplied.

Further, in the mounting process, before the pick-up, which is the time when the component is not gripped, and at the time of the mounting, mounting head 20 sets third valve 38 to be at the second position (Pos2) and sets the positive pressure chuck to be in the unclamping state. In addition, in the mounting process, at the time of the pick-up and the moving when the component is gripped, mounting head 20 sets third valve 38 to be at the first position (Pos1), and sets the positive pressure chuck to be in the clamping state.

1-6-3. Mounting Process Using Negative Pressure Chuck

Here, it is assumed that a negative pressure chuck (not shown) as a tool is attached to tool shaft 24 of mounting head 20. The negative pressure chuck does not have pusher 71 unlike lead chuck 60 and is a tool that shifts from the unclamping state to the clamping state in a case where negative pressure air is supplied. Therefore, as shown in FIG. 6, mounting head 20 maintains the states of first valve 36 and second valve 37 in any state in the mounting process, and switches the unclamping state and the clamping state only by the switching of third valve 38.

Specifically, mounting head 20 turns off first positive pressure valve BP1 of first valve 36 and turns on first negative pressure valve BN1. Accordingly, first air passage 31 is in a state in which negative pressure air is supplied. In addition, mounting head 20 turns on second positive pressure valve BP2 of second valve 37 and turns off second negative pressure valve BN2. Accordingly, second air passage 32 is in a state in which low positive pressure air is supplied.

Further, in the mounting process, before the pick-up, which is the time when the component is not gripped, and at the time of the mounting, mounting head 20 sets third valve 38 to be at the second position (Pos2) and sets the negative pressure chuck to be in the unclamping state. In addition, in the mounting process, at the time of the pick-up and the moving when the component is gripped, mounting head 20 sets third valve 38 to be at the first position (Pos1), and sets the negative pressure chuck to be in the clamping state.

1-6-4. Mounting Process Using Suction Nozzle 50

Here, it is assumed that suction nozzle 50 (see FIG. 3A) as a tool is attached to tool shaft 24 of mounting head 20. Suction nozzle 50 is a tool that is supplied with negative pressure air to suck the component. Before the pick-up, mounting head 20 turns off first positive pressure valve BP1 of first valve 36 and turns on first negative pressure valve BN1. Accordingly, first air passage 31 is in a state in which negative pressure air is supplied. Further, mounting head 20 turns off both second positive pressure valve BP2 and second negative pressure valve BN2 of second valve 37. Accordingly, second air passage 32 is in a state in which negative pressure air is not supplied.

Further, mounting head 20 sets third valve 38 to be at second position (Pos2) and causes second air passage 32 to communicate with common air passage 33. Accordingly, suction nozzle 50 is in a state in which air is not supplied. Here, in a case where air is supplied to suction nozzle 50 before a tip end of suction nozzle 50 sufficiently approaches or contacts the component, the component may be blown off or turned over due to an influence of the air. Therefore, mounting head 20 is in a state in which air is not supplied to suction nozzle 50 before the pick-up.

Next, at the time of the pick-up, while maintaining the states of first valve 36 and second valve 37, mounting head 20 sets third valve 38 to be at the first position (Pos1) and causes first air passage 31 to communicate with common air passage 33. Accordingly, negative pressure air is supplied to suction nozzle 50 via common air passage 33. Suction nozzle 50 supplied with negative pressure air is in a state in which in-nozzle air passage 51 becomes a vacuum, and the component is sucked by negative pressure air.

Subsequently, at the time of the moving, while maintaining the states of first valve 36 and third valve 38, mounting head 20 turns on second positive pressure valve BP2 of second valve 37 and turns off second negative pressure valve BN2. Accordingly, second air passage 32 is in a state in which low positive pressure air is supplied. However, at the time of the moving, since third valve 38 is not switched, a state of suction nozzle 50, in which negative pressure air is supplied, is maintained.

Finally, at the time of the mounting, while maintaining the states of first valve 36 and second valve 37, mounting head 20 sets third valve 38 to be at the second position (Pos2), and causes second air passage 32 to communicate with common air passage 33. Accordingly, low positive pressure air is supplied to suction nozzle 50 via common air passage 33. Suction nozzle 50 supplied with negative pressure air is in a state in which a vacuum breakdown occurs in in-nozzle air passage 51 and the component is not sucked.

In a case where the mounting of the components by all suction nozzles 50 attached to rotary head 23 is ended and then the component is to be picked up again, mounting head 20 turns off both second positive pressure valve BP2 and second negative pressure valve BN2 of second valve 37 in order to obtain a state before the pick-up while maintaining the states of first valve 36 and third valve 38. Accordingly, second air passage 32 is in a state in which negative pressure air is not supplied.

1-6-5. Relationship of Tool and Third Valve 38

As described above, mounting head 20 appropriately switches the states of first valve 36 and second valve 37 according to the tool to set states in which the high positive pressure air, the low positive pressure air, and the negative pressure air can flow through first air passage 31 and second air passage 32. Accordingly, regardless of a type of the tool attached to mounting head 20, it is possible to set the operation of third valve 38 to be shared.

Specifically, in a case where the tool is lead chuck 60 or the positive pressure chuck that grips the component with the positive pressure air, third valve 38 is set to be at the first position (Pos1) when the component is gripped at the time of the pick-up and moving. In addition, in a case where the tool is the negative pressure chuck or suction nozzle 50 that grips the component or sucks the component respectively with negative pressure air, at the time of the pick-up and the moving when the component is gripped or sucked, third valve 38 is similarly set to be at the first position (Pos1).

2. Effects of the Configuration of Embodiment

According to the configuration of mounting head 20 including air supply circuit 30, by switching first valve 36 and second valve 37, positive pressure air and negative pressure air can be selectively caused to flow in first air passage 31, and positive pressure air and negative pressure air can be selectively caused to flow in second air passage 32. Therefore, switching of third valve 38 can cause the air supplied to the tool to switch between positive pressure and negative pressure. Accordingly, mounting head 20 can handle various tools such as lead chuck 60 or the positive pressure chuck which picks up the component with positive pressure air, and negative pressure chuck or suction nozzle 50 which picks up the component with negative pressure air.

In addition, according to the configuration of mounting head 20 including passage shutoff device 40, it is possible to prevent leakage of positive pressure air or negative pressure air from common air passage 33. In addition, in a case where multiple tools are attachable to mounting head 20 and the number of attached tools is smaller than the maximum number, the air pressure supplied to the tools can be stabilized. Further, the operation load on the air supply source can be reduced.

3. Modification Aspect of Embodiment

3-1. Regarding Air Supply Circuit 30 of Mounting Head 20

In the embodiment, in air supply circuit 30, first valve 36 is constituted by first positive pressure valve BP1 and first negative pressure valve BN1, and second valve 37 is constituted by second positive pressure valve BP2 and second negative pressure valve BN2. On the other hand, at least one of first valve 36 and second valve 37 may be constituted by a single valve.

Specifically, for example, first valve 36 may be constituted by a three-position solenoid valve having two solenoids. In such a configuration, in a case where the first solenoid is powered, first valve 36 causes positive pressure air passage 34 to communicate with first air passage 31, and in a case where the second solenoid is powered, first valve 36 causes negative pressure air passage 35 to communicate with first air passage 31. Further, at an intermediate position in which neither a first solenoid nor a second solenoid is powered, first valve 36 is in a state in which air is not supplied to first air passage 31.

Similarly, the three-position solenoid valve can be applied to second valve 37. According to the above-described configuration, the number of components necessary for constituting air supply circuit 30 can be reduced. From the viewpoint of increasing the number of patterns of the communication state and the shutoff state in air supply circuit 30, or from the viewpoint of miniaturizing the solenoid valve and reducing the cost, an aspect exemplified in the embodiment is preferable.

In the embodiment, a configuration is adopted in which regulator valve 39 is disposed between positive pressure air supply source 81 and second valve 37. On the other hand, regulator valve 39 can adopt various aspects in accordance with the specification of the tool or the like, as long as regulator valve 39 is disposed in at least one of locations between positive pressure air supply source 81 and first valve 36, between positive pressure air supply source 81 and second valve 37, between negative pressure air supply source 82 and first valve 36, and between negative pressure air supply source 82 and second valve 37.

According to such a configuration, it is possible to switchably supply high positive pressure air and low positive pressure air to the tool as exemplified in the embodiment, or to switchably supply high negative pressure air and low negative pressure air to the tool by disposing a regulator valve in negative pressure air passage 35. Accordingly, improving performance and expanding functionality for the tool is possible. In addition, by disposing the regulator valve at an appropriate position, it becomes possible to handle the various tools and to widen the usage of mounting head 20.

In the embodiment, a configuration is adopted in which third valve 38 is a two-position mechanical valve having spool 381. On the other hand, third valve 38 can adopt various aspects as long as third valve 38 is configured to selectively cause first air passage 31 or second air passage 32 to communicate with common air passage 33. Specifically, third valve 38 may be configured as a three-position valve that does not supply air to common air passage 33 or as a solenoid valve that is switched by a solenoid.

3-2. Regarding Configuration of Mounting Head 20

In the embodiment, mounting head 20 is configured to include air supply circuit 30 capable of switching the air supplied to first air passage 31 and second air passage 32 between positive pressure and negative pressure, and passage shutoff device 40 that shuts off the air flow between common air passage 33 and the outside in a case where the tool is removed. On the other hand, mounting head 20 may be configured to include any one of either air supply circuit 30 or passage shutoff device 40.

For example, passage shutoff device 40 exemplified in the embodiment may be applied to a mounting head including an air supply circuit in which negative pressure air is constantly supplied to the first air passage and the positive pressure air is constantly supplied to the second air passage, as in the related art. According to such a configuration, for example, in a case where mounting head 20, for which the number of attached suction nozzle 50 is smaller than the maximum number, is used for rotary head 23 to which multiple suction nozzles 50 are attachable, in the mounting process, it is possible to prevent the leakage of the air in tool shaft 24 to which suction nozzle 50 is not attached. Accordingly, the air pressure in the air supply circuit can be maintained properly and easily, and the component can be reliably held. In addition, the operation load of the air supply source can be reduced.

In addition, in the embodiment, passage shutoff device 40 is set to be a slide valve that moves seal member 42 in the axial direction of tool shaft 24 to turn on and shut off the flow of air. On the other hand, passage shutoff device 40 can adopt various aspects as long as the air flow can be shut off between common air passage 33 and the outside in a case where the tool is removed.

Specifically, as described above, third valve 38 is configured as a three-position valve and adds a shutoff position in which air is not supplied to common air passage 33. Further, in a case where the tool is removed from tool shaft 24, third valve 38 is set to be at the shutoff position so that the air flow between common air passage 33 and the outside can be substantially shut off. However, in order to automatically switch between turning on and shutting off of communication states between common air passage 33 and the outside in conjunction with attaching and detaching the tool, the aspect exemplified in the embodiment is preferable.

In the embodiment, mounting head 20 is configured to include rotary head 23 to which multiple tools are attachable. On the other hand, mounting head 20 may adopt a configuration in which one tool is attachable, or may adopt a configuration in which a larger number of tools are attachable. In the above-described configuration, it is possible for first air passage 31 and second air passage 32 to branch according to the number of tools such that air supply circuit 30 and passage shutoff device 40 exemplified in the embodiment are similarly applied.

REFERENCE SIGNS LIST

20: mounting head, 30: air supply circuit, 31: first air passage, 32: second air passage, 33: common air passage, 34: positive pressure air passage, 35: negative pressure air passage, 36: first valve, BP1: first positive pressure valve, BN1: first negative pressure valve, 37: second valve, BP2: second positive pressure valve, BN2: second negative pressure valve, 38: third valve, 381: spool, 39: regulator valve, 40: passage shutoff device, 41: locking section, 42: seal member, 43: in-shaft compression spring, 50: suction nozzle (tool), 60: lead chuck (tool)

The invention claimed is:

1. A mounting head, to which a tool configured to pick up a component by being supplied with positive pressure air or negative pressure air is detachably attached, configured to be used for a mounting process in which the component picked up by the tool is mounted on a circuit board, the mounting head comprising:
- a first air passage and a second air passage configured to flow air;
- a first valve configured to switch the air flowing through the first air passage between the positive pressure air and the negative pressure air;
- a second valve configured to switch the air flowing through the second air passage between the positive pressure air and the negative pressure air;
- a common air passage configured to communicate with the tool; and
- a third valve configured to selectively connect the first air passage or the second air passage with the common air passage.

2. The mounting head according to claim 1,
wherein the first valve selectively causes a positive pressure air supply source configured to supply the positive pressure air, or a negative pressure air supply source configured to supply the negative pressure air, to communicate with the first air passage to switch the air flowing through the first air passage between positive pressure and negative pressure, and
wherein the second valve selectively causes the positive pressure air supply source or the negative pressure air supply source to communicate with the second air passage to switch the air flowing through the second air passage between positive pressure and negative pressure.

3. The mounting head according to claim 2,
wherein the first valve includes:
- a first positive pressure valve configured to switch between turning on and shutting off of communication states between the first air passage and the positive pressure air supply source,
- a first negative pressure valve configured to switch between turning on and shutting off of communication states between the first air passage and the negative pressure air supply source; and wherein the second valve includes:
- a second positive pressure valve configured to switch between turning on and shutting off of communication states between the second air passage and the positive pressure air supply source, and
- a second negative pressure valve configured to switch between turning on and shutting off of communication states between the second air passage and the negative pressure air supply source.

4. The mounting head according to claim 2, further comprising:
a regulator valve configured to regulate the pressure of the air, the regulator valve disposed in at least one of locations between the positive pressure air supply source and the first valve, between the positive pressure air supply source and the second valve, between the negative pressure air supply source and the first valve, and between the negative pressure air supply source and the second valve.

5. The mounting head according to claim 1,
wherein in a state in which positive pressure and negative pressure of the air flowing through the first air passage and the second air passage are different from each other by switching of the first valve and the second valve, the tool is switched between a holding state and a non-holding state of the component by switching of the third valve.

6. The mounting head according to claim 1,
wherein the tool includes a suction nozzle that is supplied with the negative pressure air to suck the component.

7. The mounting head according to claim 1,
wherein the tool includes a chuck that is supplied with the positive pressure air to grip the component.

8. The mounting head according to claim 1, further comprising:
a passage shutoff device configured to shut off air flow between the common air passage and an outside in a case where the tool is removed.

9. A mounting head, to which a tool configured to pick up a component by being supplied with positive pressure air or negative pressure air is detachably attached, configured to be used for a mounting process in which the component picked up by the tool is mounted on a circuit board, the mounting head comprising:
- a first air passage and a second air passage configured to flow air;
- a common air passage configured to communicate with the tool;
- a valve configured to selectively connect the first air passage or the second air passage with the common air passage; and
- a passage shutoff device configured to shut off air flow between the common air passage and an outside in a case where the tool is removed.

10. The mounting head according to claim 9,
wherein the passage shutoff device includes:
- a locking section formed in the common air passage, a seal member configured to be locked to the locking section to shut off the air flow in the common air passage, and
- an elastic member configured to urge the seal member to the locking section, and
wherein the passage shutoff device is configured to allow air to flow by way of the seal member separating from the locking section against an elastic force of the elastic member by the tool in a case where the tool is attached, and the passage shutoff device is configured to shut off the air flow by way of the seal member being urged by the elastic member to be locked to the locking section in a case where the tool is removed.

* * * * *